(12) United States Patent
Pelletier (10) Patent No.: US 9,749,882 B2
(45) Date of Patent: Aug. 29, 2017

(54) COMMERCIAL POWER RESTORE INDICATOR FOR SITES, SUCH AS CELLULAR TELECOMMUNICATIONS SITES

(71) Applicant: T-Mobile U.S.A., Inc., Bellevue, WA (US)

(72) Inventor: Gregory Pelletier, Pembroke, MA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

(21) Appl. No.: 14/966,964

(22) Filed: Dec. 11, 2015

(65) Prior Publication Data

US 2017/0171765 A1    Jun. 15, 2017

(51) Int. Cl.
| | | |
|---|---|---|
| H04M 3/00 | (2006.01) | |
| H04W 24/04 | (2009.01) | |
| G01R 19/145 | (2006.01) | |
| G08B 21/18 | (2006.01) | |
| H04L 12/24 | (2006.01) | |

(52) U.S. Cl.
CPC .......... *H04W 24/04* (2013.01); *G01R 19/145* (2013.01); *G08B 21/185* (2013.01); *H04L 41/0668* (2013.01); *H04L 41/22* (2013.01)

(58) Field of Classification Search
CPC ... H04W 24/04; G01R 19/145; G08B 21/185; H04L 41/22; H04L 41/0668
USPC ........................................................ 455/418
See application file for complete search history.

(56) References Cited

U.S. PATENT DOCUMENTS

| | | | | |
|---|---|---|---|---|
| 8,674,823 | B1* | 3/2014 | Contario ................... | H02J 1/10 340/333 |
| 8,779,927 | B2* | 7/2014 | Bell ......................... | H04Q 9/00 340/635 |
| 9,297,723 | B1* | 3/2016 | Hofmann ............... | G01M 99/00 |
| 2003/0036810 | A1* | 2/2003 | Petite ........................ | H02J 3/14 700/9 |
| 2006/0071776 | A1* | 4/2006 | White ................. | H02J 13/0086 340/538 |
| 2008/0143491 | A1* | 6/2008 | Deaver .................. | H04B 3/542 370/463 |
| 2011/0140911 | A1* | 6/2011 | Pant ....................... | H04B 3/546 340/870.02 |
| 2012/0126790 | A1* | 5/2012 | Sobotka ................. | G01D 4/002 324/119 |
| 2012/0200423 | A1* | 8/2012 | DiLuciano ........... | H04Q 3/0062 340/870.01 |
| 2012/0200426 | A1* | 8/2012 | DiLuciano ............ | H04L 41/065 340/870.07 |
| 2012/0203388 | A1* | 8/2012 | DiLuciano ............. | G06Q 10/04 700/292 |

(Continued)

*Primary Examiner* — Marceau Milord
(74) *Attorney, Agent, or Firm* — Perkins Coie LLP (57) ABSTRACT

Systems and methods are described herein for determining the restoration of power at a site, such as the restoration of commercial power to a cell site within a telecommunications network. The systems and methods may be utilized to determine whether power is restored at a cell site when a generator is currently or temporarily providing power to the cell site (e.g., during a power outage on a utility grid that provided the power to the cell site), such as by determining the presence of a generator is running alarm message and the absence of a commercial power failure message, among other messages.

14 Claims, 7 Drawing Sheets

(56) References Cited

U.S. PATENT DOCUMENTS

| | | | | |
|---|---|---|---|---|
| 2012/0324273 A1* | 12/2012 | Shaffer | ................ | H04L 45/02 |
| | | | | 714/4.12 |
| 2013/0345888 A1* | 12/2013 | Forbes, Jr. | ............... | H02J 3/14 |
| | | | | 700/291 |
| 2014/0362486 A1* | 12/2014 | O'Regan | ................ | H02H 3/10 |
| | | | | 361/87 |
| 2015/0261241 A1* | 9/2015 | McKeag | ............... | G05B 15/02 |
| | | | | 700/295 |
| 2016/0020997 A1* | 1/2016 | Hui | ...................... | H04B 1/713 |
| | | | | 370/225 |

\* cited by examiner

COMMERCIAL POWER RESTORE INDICATOR FOR SITES, SUCH AS CELLULAR TELECOMMUNICATIONS SITES

BACKGROUND

During outages of power provided to cell sites by a commercial power utility (e.g., via a utility grid), a telecommunications network provider may deploy generators to affected sites, in order to provide supplemental or temporary power to the sites during the outages. This temporary provision of power, via the deployed generators, enables the network provider to maintain normal operations of the cell sites during the outages to the utility, which benefits customers of the network provider who utilize network provided services like voice, text, and/or data communications via associated mobile devices (e.g., smart phones, tablets, laptops, and so on).

Typically, the network provider, via their emergency operations center (EOC), sends field technicians to the generator-powered cell sites to identify or confirm sites where commercial power has been restored. For example, after a large outage (e.g., an outage affecting a large area with many cell sites), the EOC may send out large numbers of technicians over many work shifts to deploy generators and identify when sites have been restored. Thus, a generator at a cell site may operate for many hours after power to the cell site has been restored and before a technician arrives to determine power from the utility grid has been restored and to shut off the generator. Such an arrangement has various drawbacks, such as costs associated with wasted fuel at unneeded generators, costs associated with technician time to travel and inspect cell sites, and so on.

BRIEF DESCRIPTION OF THE DRAWINGS

Embodiments of the present technology will be described and explained through the use of the accompanying drawings.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Systems and methods are described herein for determining the restoration of power at a site, such as the restoration of commercial electrical power to a cell site within a cellular telecommunications network. The systems and methods may be utilized to determine power is restored at a cell site when a generator is currently or temporarily providing power to the cell site (e.g., during a power outage on a utility grid that provided the power to the cell site).

For example, the systems and methods may include a first relay, connected to a power protection cabinet (PPC) of a cell site, which sends a first signal representing a lost power state of the cell site, which indicates that the site has lost commercial electrical power. The systems and methods also may include a second relay, connected to the power protection cabinet, which sends a second signal representing a generator powered state of the site, in other words, indicating that a generator is providing power to the site (e.g., during an outage of power from the commercial utility to the site). The systems and methods determine that power is restored and available from a commercial utility at a generator-powered cell site when detecting the second signal without the first signal (e.g., the first signal being cleared).

Thus, in some embodiments, the systems and methods may enable a network provider to receive immediate, automatic, notifications of power restorations at cell sites running on temporary generator power. This allows the network provider to efficiently control operations of generators and other resources as well as effectively deploy field and service technicians to cell sites during outages and restorations, among other benefits.

The following description, for the purposes of explanation, numerous specific details are set forth in order to provide a thorough understanding of embodiments of the present technology. It will be apparent, however, that embodiments of the present technology may be practiced without some of these specific details.

Examples of Power Restoration Indication Systems

As described herein, a power protection cabinet (PPC) of a cell site may include various components or devices that provide power restoration indication messages or alarms when commercial (or, utility grid-based) electrical power is restored to the cell site after an outage or other issue associated with providing power to the cell site.

Figure 1:
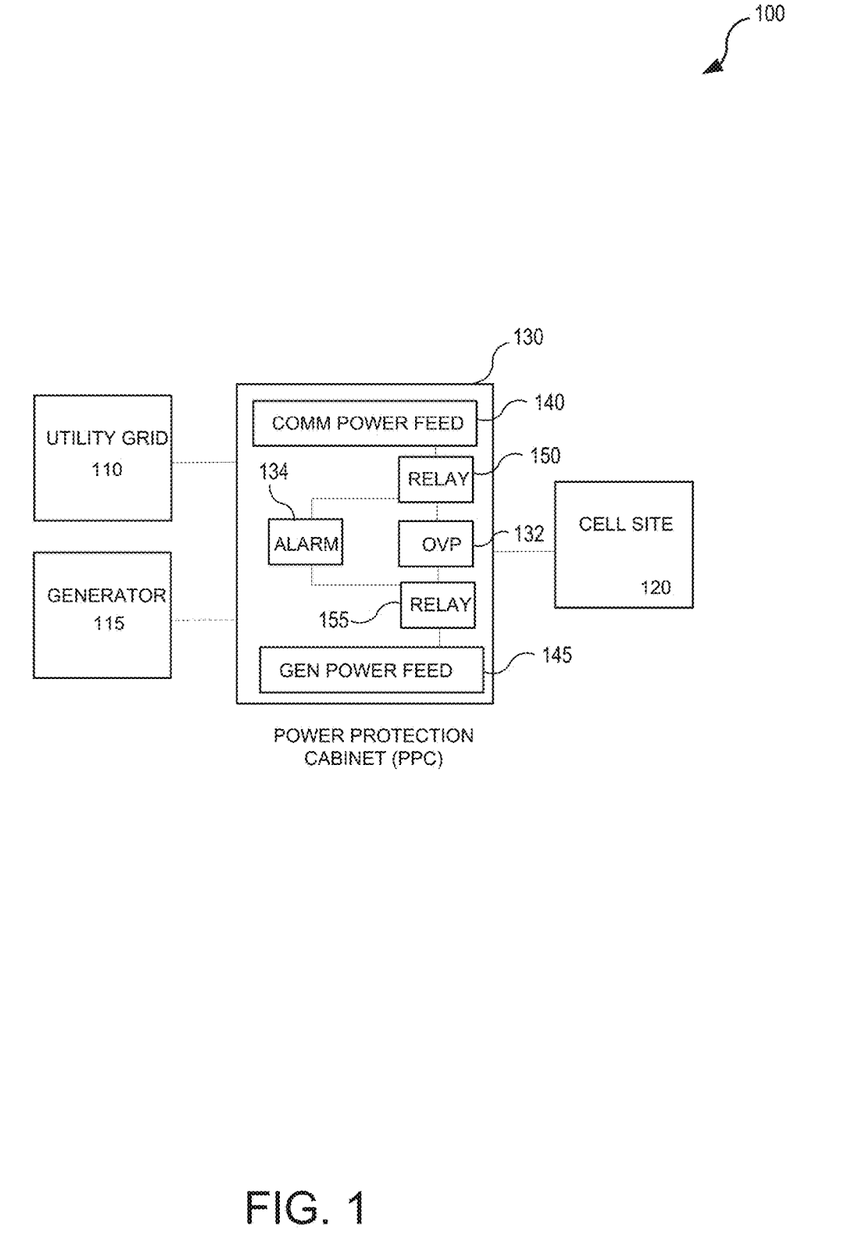
FIG. 1 is a block diagram illustrating components of a power restoration indication system.

FIG. 1 is a block diagram illustrating components of a power restoration indication system 100. A cell site 120 is connected to a utility grid 110 (or, an optional generator 115) via a power protection cabinet 130, and receives commercial power from the utility grid 110. The cell site 120 may be a cell site within a telecommunications network. For example, the cell site 120 may be a raw land site or other stand-alone site (e.g., stand-alone base station), a small cell site (e.g., a picocell, femtocell, microcell, and so on, and may include a self-support tower on which antennas are fixed and positioned to provide telecommunication services to mobile devices and other wireless devices within or proximate to the antennas.

The PPC 130 is positioned between the utility grid 110 and the cell site 120, and includes power transfer devices configured to distribute power to various locations within the cell site, devices configured to protect the cell site from variations (e.g., surges) in power received from the utility grid 110, and so on. For example, the PPC 130 may include power transfer pedestals AC/generator power transfer points, mechanical circuit breakers, bad centers, surge suppressors, and various compartments for mounting telecommunications (e.g., "telco") and other components.

The PPC 130 includes an over voltage protection (OVP) component 132, such as an OVP circuit or controller that protects from an overvoltage being applied to various devices of the cell site 120. The OVP component 132 may connect or communicate to an alarm component 134, such as a Site Alarm Unit (SAU) and/or external block of a Base Transceiver Station (BTS) Enclosure, in order to send signals associated with voltage fluctuations and other power distribution issues.

The power restoration indication system 100 may utilize such a configuration when integrating components, such as components of the power restoration indication system 100, to monitor and identify what devices (e.g., the grid 110 and/or generator 115) are providing power to the cell site 120 via the PPC 130.

The PPC 130 includes a first relay 150 that is connected to a commercial power feed component 140 and the OVP 132, in order to monitor whether power is being provided to the cell site 120 (via the PPC 130) from the utility grid 110. The PPC 130 includes a second relay 155 that is connected to a generator power feed component 145 and the OVP 132, in order to monitor whether power is being provided to the cell site 120 (via the PPC 130) from the generator 115. The relays 150, 155, may also be coupled to the alarm component 134, in order to send signals to the alarm component 134 based on whether power is being supplied into the PPC 130 via the commercial power feed 140 and/or the generator power feed 145.

The alarm component 134, which is described in more detail herein, is configured to send and transmit various alarm messages associated with the state of the PPC 130, the state of the OVP component 132, and/or the state of the relays 150, 155. These alarm messages, when received in various combinations, may indicate certain states of the PPC 130 and associated cell site 120, such as overvoltage states, commercial-based power states, generator-based power states, power outage states, power restoration states, and so on.

The power restoration indication system 100 may be included in PPCs that are newly deployed to a cell site and/or installed (e.g., retrofit) into existing PPCs. An example installation is as follows.

Although various different cell sites 120 and site locations may utilize the power restoration indication system 100, certain cell sites may benefit specifically from a mechanism that provides immediate notifications of power being restored to sites running with generators. For example, such sites may be a raw land site with a self-support tower, may include a certain style/configuration/sized PPC 130 (e.g., sites with 2G & 3G/2000 series & 3000 series PPCs) and/or certain generator plug/connector configurations. Also, the site locations may include locations where commercial power is slow to be restored (e.g., rural or isolated locations), planned site builds and sites scheduled for modernization (e.g., upgrades to the PPCs), sites where power is often out due to storms or other issues, and so on.

Once a site is selected, installation of components configured to provide power restoration indications may include some or all of the following actions:

The installation of two RIB (relay-in-a-box) relays (e.g., relays 150, 155) in the telco section (power distribution portion) of the PPC 130;

The installation of two 5 A in-line fuses on the commercial power feed 140 using live taps, so power will not be interrupted to feed the RIB relay 150 with 240V;

The installation of two 5 A in-line fuses on the generator power feed 145 using live taps, so power will not be interrupted to feed the RIB relay 155 with 240V;

The installation of a Cat 5 cable (or, use existing one already in the PPC 13), to run contacts from the relays to a BTS external alarm block (e.g., alarm component 134), using 1 pair of the Cat 5 cable for a "generator power alarm," and using another pair of the Cat 5 cable for a "no commercial power available" alarm;

The connection of the Cat 5 cable to the external alarm block in the BTS (ensuring that the patch cord is connected to, and terminates at, the correct ports on an associated SAU module, and that a connection between the SAU and a fan control unit is verified). Of course, other installation configurations are possible.

Thus, the relays 150, 155, being installed within a power distribution portion of the PPC 120 (e.g., connected to the OVP 132), may provide signals associated with the presence or absence of power within a commercial power feed 140 and/or generator power feed 145. The alarm component 134 may utilize such signals to generate alarm messages associated with various powered states of the PPC 130 and/or cell site 120, which indicate whether power has been restored to the cell site 120.

Figure 2:
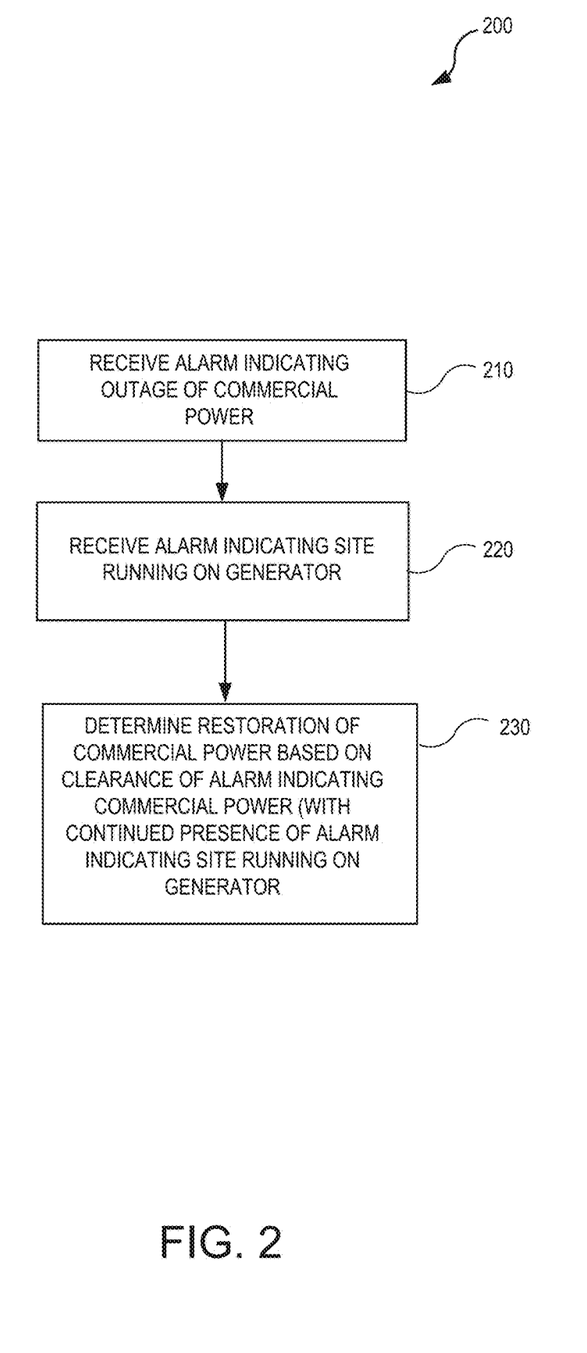
FIG. 2 is a flow diagram illustrating a method for determining a restoration of commercial power to a site, such as a cell site.

FIG. 2 is a flow diagram illustrating a method 200 for determining a restoration of commercial power to a site, such as a cell site. In operation 210, the system receives a first alarm message from the alarm component 134 at the power protection cabinet 130 of the cell site 120 that indicates an outage of power at the cell site 120. The first alarm message may be a commercial power fail alarm that indicates a lost power state of the cell site 120. For example, the alarm component 134 may receive a signal from the relay 150 connected to the power protection cabinet 130 of the cell site 120, where the relay 150 sends a signal representing a lost power state of the cell site 120.

In operation 220, the system receives a second alarm message from the alarm component 134 that indicates that the generator 115 is providing power to the cell site 120. The second alarm message may be a "site running on generator" alarm, which indicates that the cell site 120 is running on power provided by the generator 115 during a generator supplied power state of the cell site 120. For example, the alarm component 134 may receive a signal from the relay 155 connected to the power protection cabinet 130 of the cell site 120, where the relay 155 sends a signal representing a generator supplied power state of the cell site 120 that is based on the generator 115 providing power to the cell site 120 during the outage of power from the commercial utility 110 to the cell site 120.

The system may receive the message at or within the PPC 130, or at other locations remote from the PPC 130, such as at a network operations control center (NOCC), an emergency operations controller (EOC), or other locations associated with the management or control of the wireless communications network.

In operation 230, the system determines that power has been restored at the cell site based on a clearance of the first alarm message that indicates the outage of power at the cell site has cleared, and based on a presence of the second alarm message that indicates the generator is providing power to the cell site.

In some embodiments, the system may automatically send a restoration notification to the NOCC, the EOC, a network Switch, or other control devices or systems of the telecommunications network, upon determining power has been restored at a site where a generator is currently running. The various control centers may then deploy field technicians in response to the restoration notifications.

Thus, in some embodiments, the restoration indication system may utilize relays 150, 155 connected to various power distribution components (e.g., OVP 132) of the PPC 130 in order to identify current power states (e.g., a normal, or grid-supplied power state and/or a temporary, or generator-supplied power state) for the cell site 120. The system may also utilize various alarm components (e.g., alarm 134) in order to generate and transmit alarm messages indicative of power being restored to the cell site 120.

For example, FIGS. 3A-3E illustrate user interfaces that depict the provisioning and selecting of alarm messages utilized by the power restoration indication system.

Figure 3A:
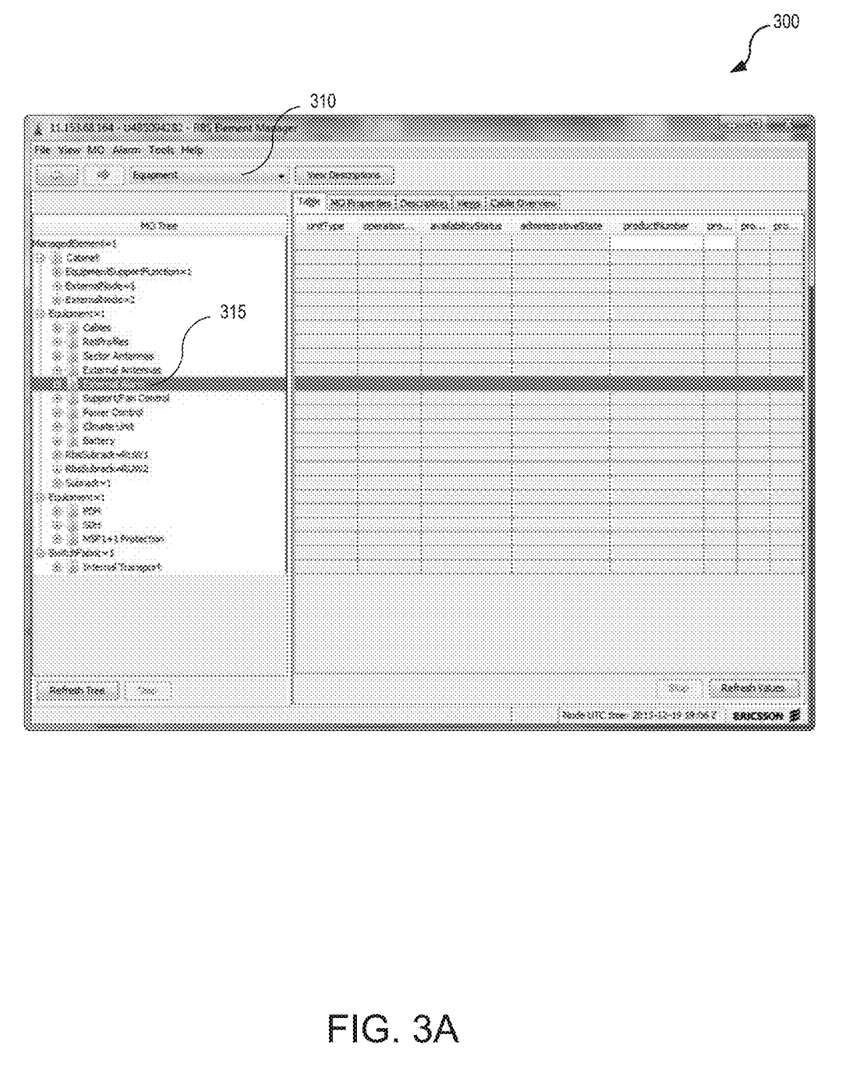
FIGS. 3A-3E are display diagrams illustrating various user interfaces provided by the power restoration indication system.

FIG. 3A depicts a user interface 300 of a management system associated with the cell site 120, such as a system that manages the control, provisioning, customization, and so on, of network components and elements for a wireless telecommunications network (e.g., the Element Manager by Ericsson®). The user interface 300 includes a list of equipment 310 and other devices to be configured via the management system, including an entry 315 for "external alarms" of a managed element (the cell site 120, or PPC 130).

Figure 3B:
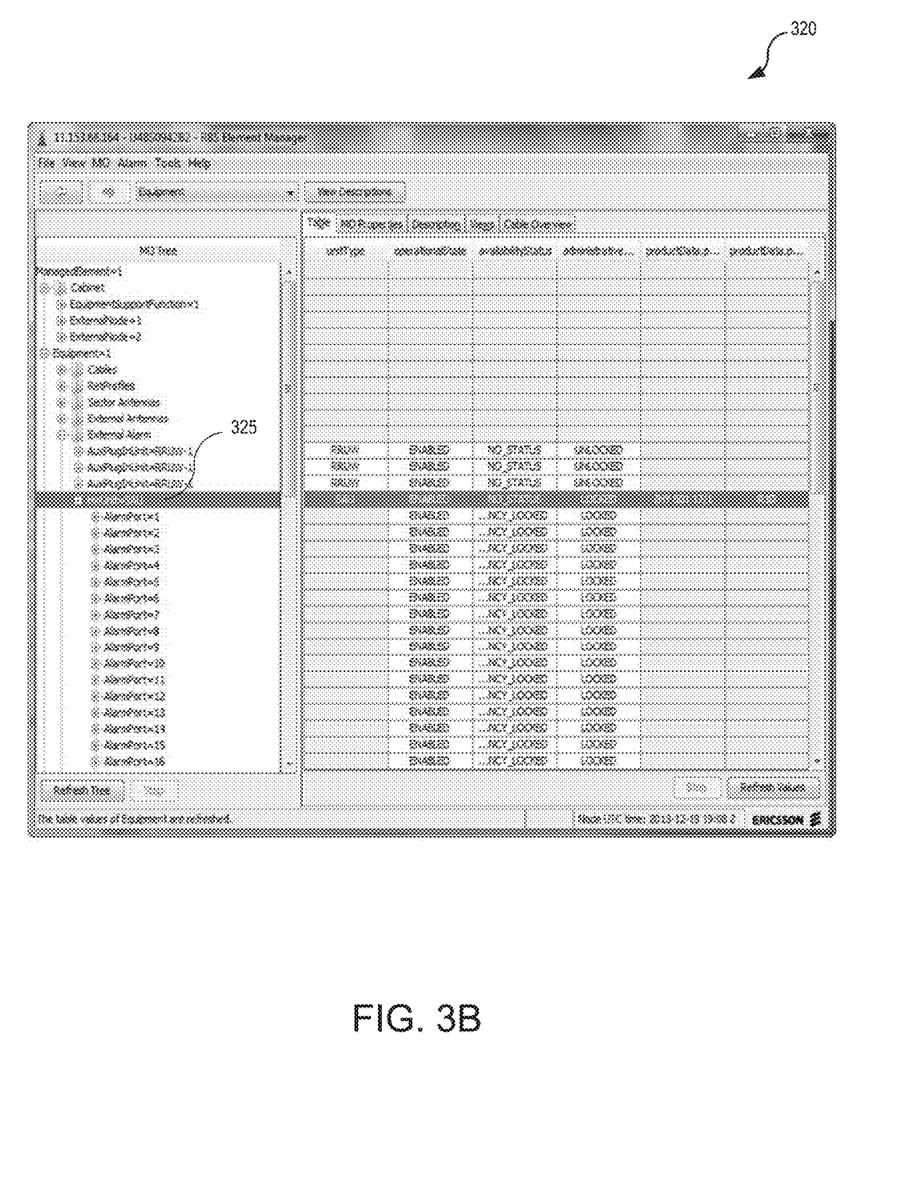

Once the "external alarms" entry 315 is selected, the management system, as depicted in user interface 320 of FIG. 3B, expands the entry 315 to include multiple entries 325 associated with alarm ports for the Site Alarm Unit (SAU) of the cell site 120.

Figure 3C:
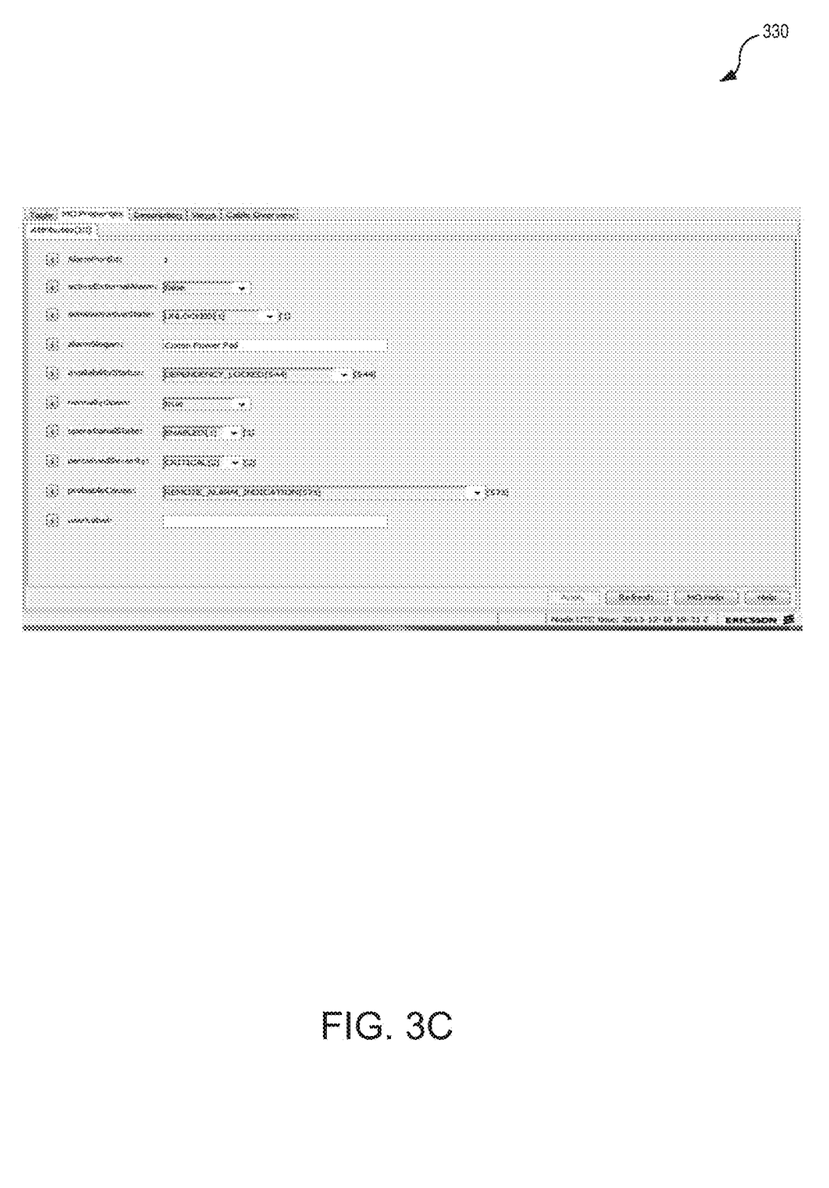

Upon selection of an alarm port (e.g. "armportID"=1), the system, as depicted in FIG. 3C), provides a user interface 330 of user-configurable display elements via which a user (e.g., site engineer) may configure the alarm messages described herein. The user interface 330 may display various parameters to be set by the user via a MO (Managed Object) Properties tab. For example, the user may make the following selections when provisioning the "commercial power fail" alarm message:

Define an alarmslogan parameter as a "Comm Power Fail";

Set normallyOpen parameter to true;

Set perceivedSeverity parameter to Critical[2];

Set probablecause parameter to Remote_Alarm_Indication; and so on.

Figure 3D:
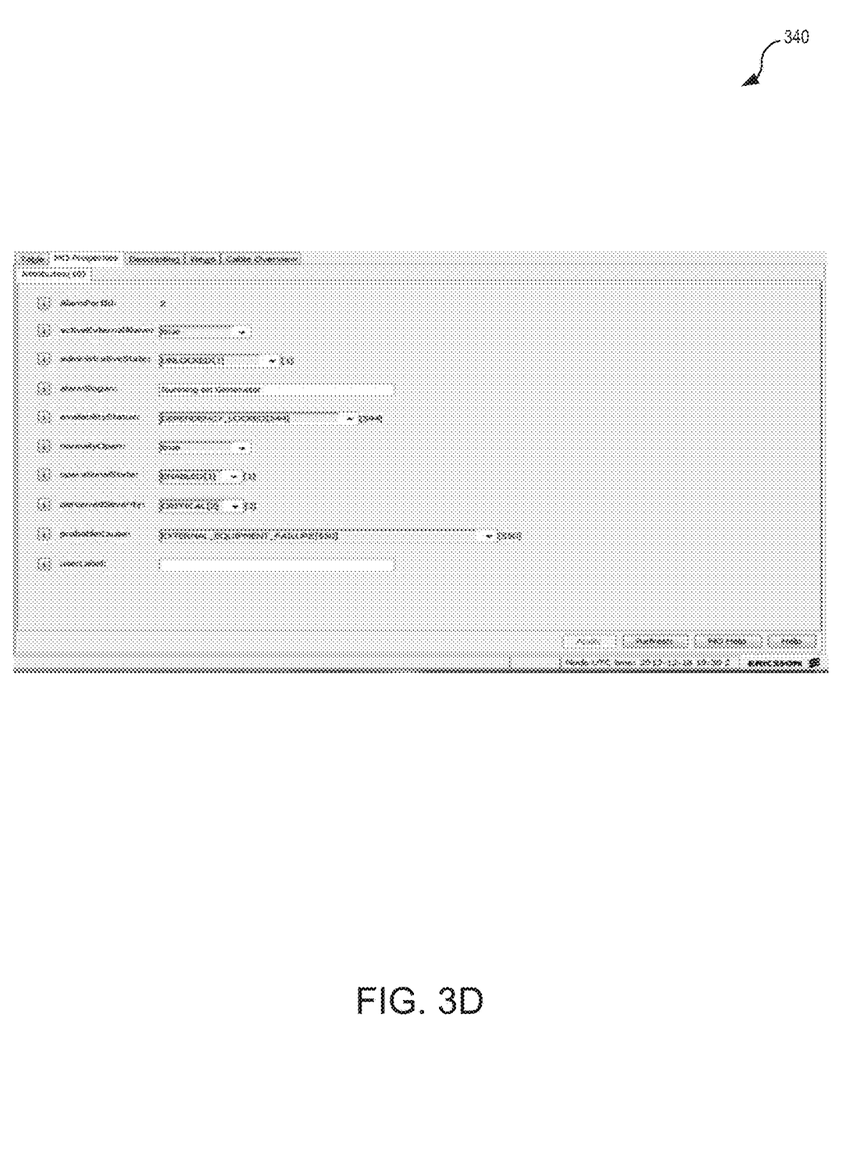

Similarly, as depicted in FIG. 3D, the user may make parameter selections when provisioning the "site running on generator alarm" message via user interface 340, as follows:

Define an alarmslogan parameter as a "Running on Generator";

Set normallyOpen parameter to true;

Set perceivedSeverity parameter to Critical[2];

Set probablecause parameter to Remote_Alarm_Indication; and so on.

Figure 3E:
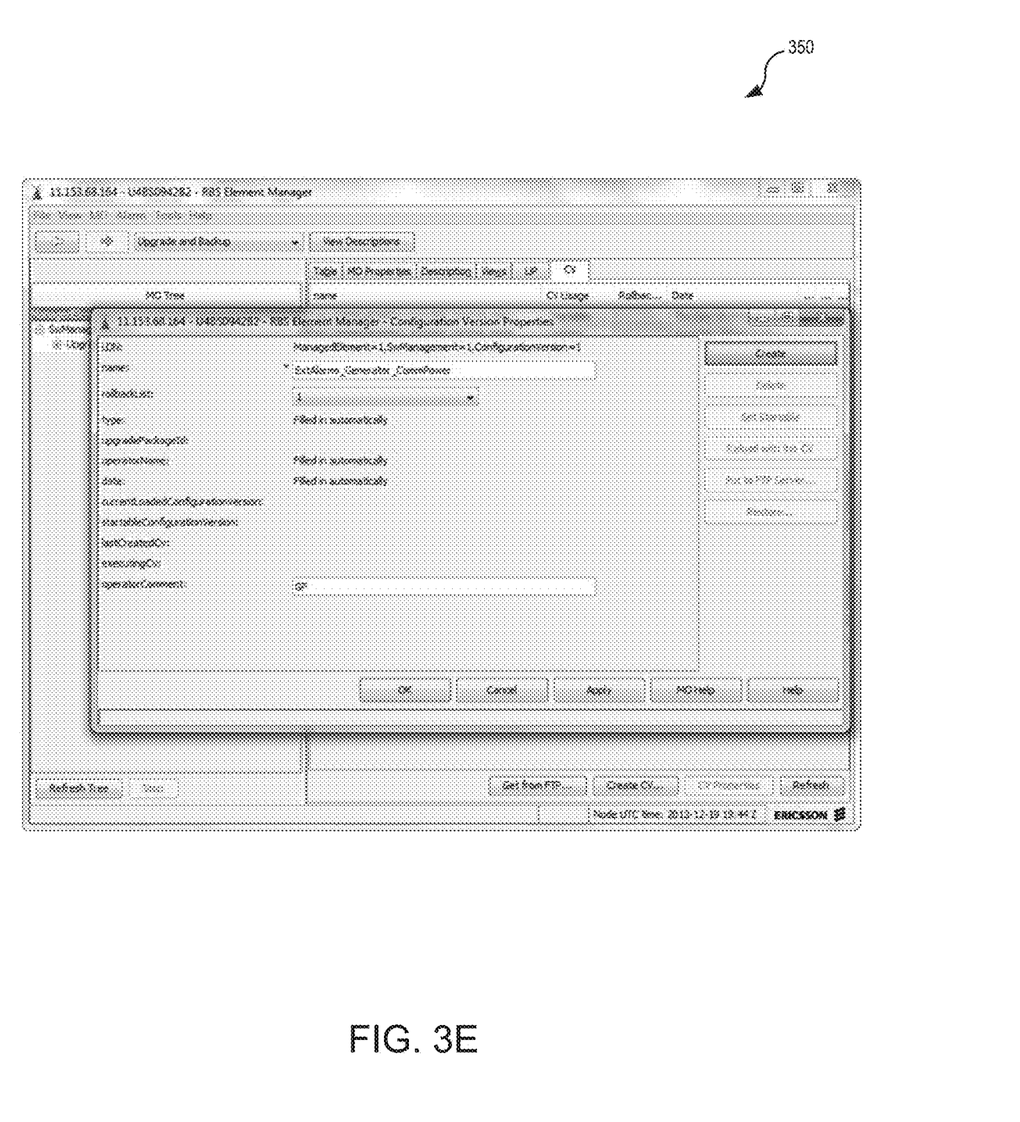

Once parameters for alarm message have been provisioned, the user, via user interface 350 depicted in FIG. 3E, creates a configuration version, with associated properties, in order to maintain the newly created alarm messages in the system.

Thus, the management system, via various provided user interfaces, enables users to create and provision the different alarm messages that indicate the restoration of power to a site running on a generator.

Therefore, the systems and methods enable power protection cabinets 130 at cell sites 120 to immediately notify various network management centers or controllers when power has been restored to those cell sites 120 that have been running on generators 115 after outages to commercial power grids 110 that normally supply power to the cell sites 120.

As described herein, the PPC 130 may provide or facilitate such immediate notifications when configured with the following components:

a first relay, connected to a power protection cabinet of the wireless telecommunications site, wherein the first relay is configured to send a first signal representing a lost power state of the wireless telecommunications site, and wherein the power protection cabinet includes power transfer devices configured to protect the wireless telecommunications site.

a second relay, connected to the power protection cabinet, wherein the second relay is configured to send a second signal representing a generator supplied power state of the wireless telecommunications site, and wherein the second signal is based on the backup generator providing power to the wireless telecommunications site during an outage of power from the commercial utility to the wireless telecommunications site, and a processor or microcontroller programmed to determine that power is again available from the commercial utility at the wireless telecommunications site after the lost power state, wherein the processor or microcontroller determines that power is again available from the commercial utility upon first detecting an alarm associated with the second signal and then detecting a clearing of an associated with the first signal.

Conclusion

The Figures and the discussion herein provide a brief, general description of a suitable computing environment 100 in which the system can be supported and implemented. Although not required, aspects of the system are described in the general context of computer-executable instructions, such as routines executed by a general-purpose computer, e.g., mobile device, a server computer, or personal computer. The system can be practiced with other communications, data processing, or computer system configurations, including: Internet appliances, hand-held devices (including tablet computers and/or personal digital assistants (PDAs)), all manner of cellular or mobile phones, multi-processor systems, microprocessor-based or programmable consumer electronics, set-top boxes, network PCs, mini-computers, mainframe computers, and the like.

Aspects of the system can be embodied in a special purpose computing device or data processor that is specifically programmed, configured, or constructed to perform one or more of the computer-executable instructions explained in detail herein. Aspects of the system may also be practiced in distributed computing environments where tasks or modules are performed by remote processing devices, which are linked through a communications network, such as a Local Area Network (LAN), Wide Area Network (WAN), or the Internet. In a distributed computing environment, program modules may be located in both local and remote memory storage devices.

Aspects of the system may be stored or distributed on computer-readable media (e.g., physical and/or tangible non-transitory computer-readable storage media), including magnetically or optically readable computer discs, hard-wired or preprogrammed chips (e.g., EEPROM semiconductor chips), nanotechnology memory, or other data storage media. Indeed, computer implemented instructions, data structures, screen displays, and other data under aspects of the system may be distributed over the Internet or over other networks (including wireless networks), on a propagated signal on a propagation medium (e.g., an electromagnetic wave(s), a sound wave, etc.) over a period of time, or they may be provided on any analog or digital network (packet switched, circuit switched, or other scheme). Portions of the system reside on a server computer, while corresponding portions reside on a client computer such as a mobile or portable device, and thus, while certain hardware platforms are described herein, aspects of the system are equally applicable to nodes on a network. In an alternative embodiment, the mobile device or portable device may represent the server portion, while the server may represent the client portion.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively, The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. §112(f) will begin with the words "means for", but use of the term "for" in any other context is not intended to invoke treatment under 35 U.S.C. §112(f). Accordingly, the applicant reserves the right to pursue additional claims after filing this application to pursue such additional claim forms, in either this application or in a continuing application.

What is claimed is:

1. A system for determining whether electrical power has been restored to a wireless telecommunications site, wherein the wireless telecommunications site receives power from a commercial utility, and wherein the wireless telecommunications site includes a backup power generator, the system comprising:

a first relay, connected to a power protection cabinet of the wireless telecommunications site,
      wherein the first relay is configured to send a first signal representing a lost power state of the wireless telecommunications site, and
      wherein the power protection cabinet includes power transfer devices configured to electrically protect the wireless telecommunications site;
   a second relay, connected to the power protection cabinet,
      wherein the second relay is configured to send a second signal representing a generator supplied power state of the wireless telecommunications site,
      wherein the second signal is based on the backup generator providing power to the wireless telecommunications site during an outage of power from the commercial utility to the wireless telecommunications site; and
   a processor or microcontroller programmed to determine that power is again available from the commercial utility at the wireless telecommunications site after the lost power state,
      wherein the processor or microcontroller determines that power is again available from the commercial utility upon first detecting an alarm associated with the second signal and then detecting a clearing of an alarm associated with the first signal.

2. The system of claim 1, wherein the first signal represents a commercial power fail alarm that indicates the lost power state of the wireless telecommunications site; and
   wherein the second signal represents a site running on generator alarm that indicates the wireless telecommunications site is running on power provided by a generator during the generator supplied power state of the wireless telecommunications site.

3. The system of claim 1, wherein the first relay is a first RIB relay that couples a commercial power feed component of the power protection cabinet to an over voltage protection component of the power protection cabinet; and
   wherein the second relay is a second RIB relay that couples a generator power feed component of the power protection cabinet to the over voltage protection component of the power protection cabinet.

4. The system of claim 1, wherein the wireless telecommunications site is a small cell site of a telecommunications network.

5. The system of claim 1, wherein the wireless telecommunications site is a cell site of a telecommunications network; and
wherein the processor or microcontroller automatically sends a restoration message to a network operations control center of the telecommunications network upon determining power is available from the commercial utility at the site.

6. The system of claim 1, wherein the wireless telecommunications site is a cell site of a cellular telecommunications network; and
wherein the processor or microcontroller automatically sends a restoration message to an emergency operations center of the telecommunications network upon determining power is available from the commercial utility at the wireless telecommunications site.

7. The system of claim 1, wherein the processor or microcontroller automatically causes the generator providing power to the wireless telecommunications site to end a current operation of providing power to the wireless telecommunications site during the generator supplied power state of the wireless telecommunications site.

8. A method for determining power has been restored at a cell site that receives power from a commercial utility and that includes a backup generator, the method comprising:
receiving a first alarm message from an alarm component at a power protection cabinet of the cell site that indicates an outage of power at the cell site, wherein the first alarm message is based on a first relay connected to the power protection cabinet of the cell site that sends a first signal representing a lost power state of the cell site; and wherein the power protection cabinet receives power from the commercial utility and the generator and distributes received power to the cell site; receiving a second alarm message from the alarm component that indicates a generator is providing power to the cell site, wherein the second alarm message is based on a second relay connected to the power protection cabinet that sends a second signal representing a generator powered state of the cell site that is based on the generator providing power to the cell site during the outage of power from the commercial utility to the cell site; and determining power has been restored at the cell site based on a status of the second alarm message that indicates the generator is providing power to the cell site combined with a status of the first alarm message that indicates the outage of power at the cell site has cleared.

9. The method of claim 8, wherein the first alarm message is a commercial power fail alarm that indicates a lost power state of the cell site; and
wherein the second alarm message is a site running on generator alarm that indicates the cell site is running on power provided by the generator during a generator powered state of the cell site.

10. The method of claim 8, wherein the first alarm message is based on a first signal generated by a first RIB relay that couples a commercial power feed component of the power protection cabinet to an over voltage protection component of the power protection cabinet; and
wherein the second alarm message is based on a second signal generated by a second RIB relay that couples a generator power feed component of the power protection cabinet to the over voltage protection component of the power protection cabinet.

11. The method of claim 8, wherein the cell site is a cell site of a telecommunications network, the method further comprising:
automatically sending a restoration message to a network operations control center of the telecommunications network upon determining power has been restored at the site.

12. The method of claim 8, wherein the cell site is a cell site of a telecommunications network, the method further comprising:
automatically sending a restoration message to an emergency operations center of the telecommunications network upon determining power has been restored at the site.

13. An apparatus for monitoring power provided to a telecommunications cell site, the apparatus comprising:
a utility monitoring component that monitors whether a utility connected to the telecommunications cell site is providing power to the telecommunications cell site;
a generator monitoring component that monitors whether a generator connected to the telecommunications cell site is providing power to the telecommunications cell site: and
an alarm component that determines whether the utility is providing power to the telecommunications cell site after an outage at the telecommunications cell site when the utility monitoring component and generator monitoring component both indicate power is being provided to the telecommunications cell site, by:
receiving a first signal indicating an outage of power at the telecommunications cell site from the utility monitoring component;
receiving a second signal indicating the generator connected to the telecommunications cell site is providing power to the telecommunications cell site from the generator monitoring component; and
receiving an indication of a clearance of the first signal that indicated the outage of power at the telecommunications cell site.

14. The apparatus of claim 13, wherein the utility monitoring component is a first RIB relay that couples a commercial power feed component of a power protection cabinet of the telecommunications cell site to an over voltage protection component of the power protection cabinet; and
wherein the generator monitoring component is a second RIB relay that couples a generator power feed component of the power protection cabinet to the over voltage protection component of the power protection cabinet.

* * * * *